(12) United States Patent
Rosenegger

(10) Patent No.: US 9,835,476 B2
(45) Date of Patent: Dec. 5, 2017

(54) SCANNING ELEMENT FOR AN INDUCTIVE ANGLE-MEASURING DEVICE

(71) Applicant: DR. JOHANNES HEIDENHAIN GMBH, Traunreut (DE)

(72) Inventor: Gregor Rosenegger, Traunstein (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 0 days.

(21) Appl. No.: 14/661,221

(22) Filed: Mar. 18, 2015

(65) Prior Publication Data

US 2015/0268066 A1   Sep. 24, 2015

(30) Foreign Application Priority Data

Mar. 24, 2014   (DE) .................. 10 2014 205 397

(51) Int. Cl.
| | |
|---|---|
| G01B 7/14 | (2006.01) |
| G01B 7/30 | (2006.01) |
| H02K 11/00 | (2016.01) |
| G01D 5/244 | (2006.01) |
| G01R 33/00 | (2006.01) |
| G01D 11/24 | (2006.01) |
| G01D 5/20 | (2006.01) |

(52) U.S. Cl.
CPC .......... G01D 5/244 (2013.01); G01D 5/2053 (2013.01); G01D 11/245 (2013.01); G01R 33/0047 (2013.01)

(58) Field of Classification Search
CPC ............. G01B 7/14; G01B 7/30; H02K 11/00
USPC ............ 324/207.15, 207.16, 207.17, 207.24, 324/207.25, 207.32
See application file for complete search history.

(56) References Cited

U.S. PATENT DOCUMENTS

| | | | | |
|---|---|---|---|---|
| 4,603,238 A | * | 7/1986 | Griswold ................. | G01D 5/25 200/11 R |
| 4,810,917 A | | 3/1989 | Kumar et al. | |
| 5,892,303 A | * | 4/1999 | Wayman ............ | G03G 15/0818 307/147 |
| 7,394,219 B2 | | 7/2008 | Tenca et al. | |
| 7,449,878 B2 | | 11/2008 | Lee | |
| 7,821,256 B2 | | 10/2010 | Lee | |
| 8,350,561 B2 | | 1/2013 | Lee | |

(Continued)

FOREIGN PATENT DOCUMENTS

| | | |
|---|---|---|
| EP | 1 621 854 | 2/2006 |
| WO | 2007/000653 | 1/2007 |

OTHER PUBLICATIONS

European Search Report, dated Jul. 22, 2015, issued in corresponding European Patent Application No. 14199084.6.

Primary Examiner — Arleen M Vazquez
Assistant Examiner — Neel Shah
(74) Attorney, Agent, or Firm — Andrews Kurth Kenyon LLP

(57) ABSTRACT

A scanning element for an inductive angle-measuring device includes a printed circuit board which has exciter lines and receiver lines, and an electronic circuit. The printed circuit board is arranged in a housing, the housing having a guideway into which the printed circuit board is inserted. The guideway is formed such that the printed circuit board is positioned with form locking in a direction parallel to an axis, and by being inserted into the guideway, the printed circuit board is deformed along a circle line which is curved about the axis.

14 Claims, 4 Drawing Sheets

(56) References Cited

U.S. PATENT DOCUMENTS

| | | | |
|---|---|---|---|
| 2003/0007347 A1* | 1/2003 | Huang | A01K 85/01 362/205 |
| 2007/0001666 A1 | 1/2007 | Lee | |
| 2009/0079422 A1* | 3/2009 | Lee | G01B 7/003 324/207.16 |

* cited by examiner

SCANNING ELEMENT FOR AN INDUCTIVE ANGLE-MEASURING DEVICE

CROSS-REFERENCE TO RELATED APPLICATIONS

The present application claims priority to Application No. 10 2014 205 397.8, filed in the Federal Republic of Germany on Mar. 24, 2014, which is expressly incorporated herein in its entirety by reference thereto.

FIELD OF THE INVENTION

The present invention relates to a scanning element for an inductive angle-measuring device for determining relative positions.

BACKGROUND INFORMATION

Inductive angle-measuring devices are used as rotary encoders, for example, to determine the angular position of two machine parts rotatable relative to each other. In inductive angle-measuring devices, exciter lines and receiver lines are often applied, for example, in the form of printed conductors on one common printed circuit board that is joined firmly to a stator of a rotary encoder, for example. Situated opposite to this printed circuit board is a graduation element, on which electrically conductive and non-conductive surfaces or bars and gaps, alternating at periodic intervals, are applied as a graduation structure, and which is joined in rotatably fixed fashion to the rotor of the rotary encoder. When an electric excitation current changing or alternating over time is applied to the exciter lines or excitation coils, signals which are a function of the angular position are generated in the receiver lines or receiver coils during the relative rotation between rotor and stator. These signals are then further processed in evaluation electronics.

Inductive angle-measuring devices of this type are often used as measuring devices for electric drives to determine the relative movement or the relative position of corresponding machine parts. In this case, the position values generated are supplied to sequential electronics for controlling the drives via a suitable interface configuration.

In PCT International Published Patent Application No. WO 2007/000653, an inductive angle-measuring device is described (for example, according to FIG. 24), in which the sensor involved has a cylindrical shape.

SUMMARY

Example embodiments of the present invention provide a scanning element for an inductive angle-measuring device, the scanning element furnishing precise measuring signals and being easy to assemble.

According to an example embodiment of the present invention, the scanning element for an inductive angle-measuring device includes a printed circuit board, which has exciter lines and receiver lines, and includes an electronic circuit for the processing of signals received through the receiver lines. The printed circuit board is disposed in a housing, the housing having a guideway into which the printed circuit board is inserted. The guideway is formed such that the printed circuit board is positioned with form locking in a direction parallel to an axis. In addition, by being inserted into the guideway, the printed circuit board is deformed—especially elastically—along a circle line that is curved about the axis.

The scanning element is suitable for scanning a graduation element that has a curved lateral surface, on which at least one graduation track is disposed. In particular, the angle-measuring device may be constructed such that the housing and the graduation element are formed as two concentrically positioned rings. The geometric midpoint of the circle line, along which the printed circuit board is curved, lies on the axis about which the rotation is intended to take place during normal operation of the angle-measuring device. In particular, the printed circuit board may be implemented as a flexible printed circuit board.

The printed circuit board may be a multilayer printed circuit board.

The printed circuit board may include an epoxy material.

The printed circuit board may be no thicker than 50 µm.

On one hand, in particular, the printed circuit board is made stiff enough to take on a uniform circular shape due to the deformation, and elastic enough for insertion into the guideway.

It should be taken into consideration that a precise setting of the air gap between the printed circuit board and the radially opposite graduation element over the measuring range is important for a precise angular measurement.

The housing is usually open at the side at which the graduation element, i.e., its angular position, is able to be scanned by the scanning element. Particularly in a construction having a graduation element located radially inside, the housing side located radially inside is open, while in the case of a graduation element located radially outside, the housing side located radially outside may be open.

The housing may have an opening which is formed such that in the course of assembling the scanning element, the printed circuit board may be introduced in the tangential direction into the guideway. The tangential direction should be understood to be a direction which extends substantially perpendicular to the axis and substantially perpendicular to the radial direction. In particular, the tangential direction is the direction along which an angle measurement is to be performed.

The printed circuit board may be arranged in the housing such that an air gap is present between the housing and the printed circuit board. In particular, an air gap exists between an area of the printed circuit board in which the exciter lines and/or receiver lines are located, and the housing. The air gap extends especially in the radial direction.

In addition, the printed circuit board may be disposed in the housing such that the printed circuit board and the housing, or rather, the guideway touch each other at one edge of the printed circuit board. The edge extends especially along the long sides of the printed circuit board.

The guideway may engage with the printed circuit board at at least one edge of the printed circuit board. In other words, the printed circuit board is guided directly in the guideway at at least one edge of the printed circuit board. The guideway may engage at two edges of the printed circuit board.

Furthermore, the guideway may be arranged as a groove provided around over at least a partial circumference of the housing. In particular, the guideway may be formed as two grooves provided around over a partial circumference of the housing.

The printed circuit board may be disposed so as to extend around over an angle of 360°. Alternatively, the printed circuit board may also be disposed around over an angle smaller than 360°, so that in particular, the scanning element is formed as a ring segment.

The receiver lines and/or the exciter lines may extend in the circumferential direction over an angle of more than 180°, especially more than 225°, e.g., with an angle of at least 270°. The angle specifications relate to a central angle having a central point on the axis about which the graduation element is to rotate relative to the scanning element.

Due to the comparatively great arc length of the receiver lines, the signals generated exhibit a high degree of immunity to errors in eccentricity and wobble errors. As a result, relatively great manufacturing and assembly tolerances may be permitted.

One end of the printed circuit board may be disposed radially outside of the circle line along which the printed circuit board is placed in the guideway. This type of construction may be used when the angle-measuring device has a graduation element located radially inside.

Alternatively, one end of the printed circuit board may be disposed radially inside of the circle line along which the printed circuit board is placed in the guideway. This type of construction is used, for example, when the angle-measuring device has a graduation element located radially outside.

The printed circuit board may be arranged such that a radially oriented line extending out from the axis intersects the printed circuit board at at least two points. In this case, the printed circuit board has a form that extends by nearly 360° along a circle line, and in addition to this, then adopts a course leading radially outward or a course leading radially inward.

The printed circuit board may be joined at one end to a board on which the electronic circuit is mounted, the line also intersecting the board. In particular, the electronic circuit forms evaluation electronics for evaluating and processing the signals obtained from the receiver lines.

Especially if the printed circuit board is disposed around over an angle of 360°, the printed circuit board may be implemented at its ends such that the two ends are able to be placed so as to overlap in the axial direction. For example, the ends may have recesses for this purpose. In particular, both ends are intersected in this case by a straight line which extends parallel to the axis. The ends of the printed circuit board may be arranged such that neither exciter lines nor receiver lines are present there.

The printed circuit board may be provided in multiple parts, in which case, the parts of the printed circuit board may be joined to each other by a bridging piece.

The bridging piece may have a smaller extension than the printed circuit board in a direction parallel to the axis. For example, the printed circuit board is wider than the bridging piece.

The parts of the multipart printed circuit board may be set apart from each other by a gap in the circumferential direction. This has the advantage that when assembling the parts of the printed circuit board, a precise and easy placement of the parts relative to each other, and therefore of the receiver lines relative to each other, is possible. This is favorable for achieving precise measured values.

The housing may have a housing part which is secured in position on the housing with the aid of an undercut that extends in a direction parallel to the axis. Hereinafter, an undercut may be understood to be a recess which permits a positive engagement, especially for the form-locking transfer of radially directed forces.

Further features and aspects of example embodiments of the present invention are described in more detail below with reference to the appended Figures.

DETAILED DESCRIPTION

Figure 1:
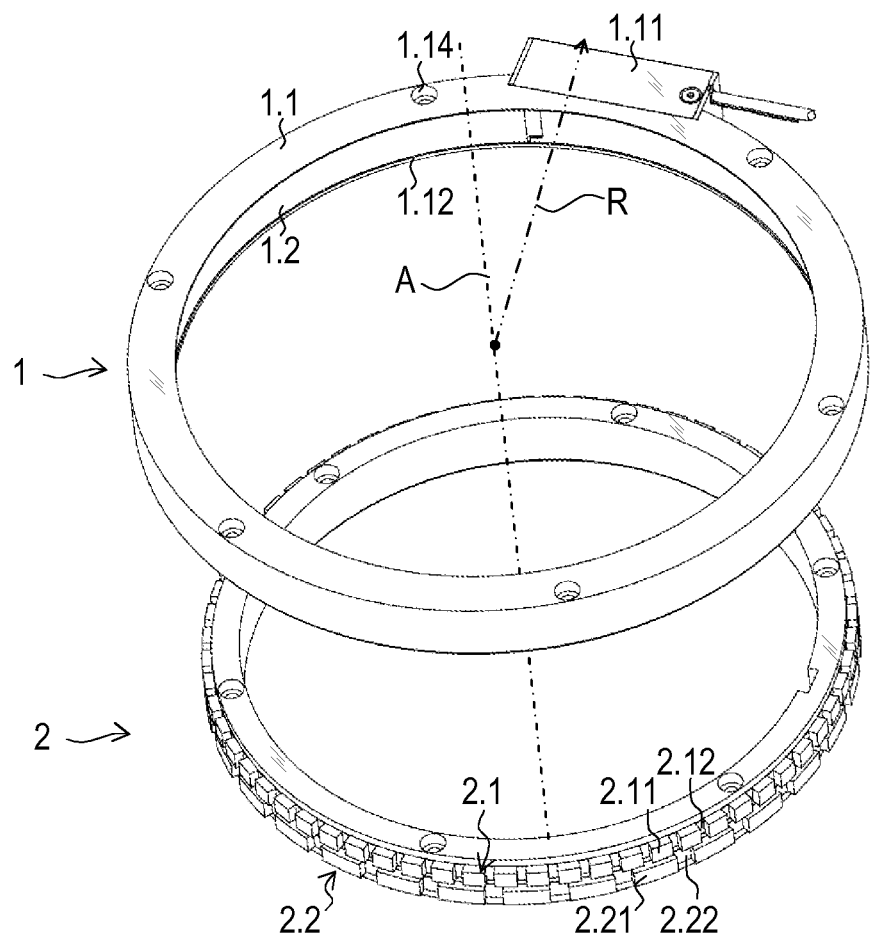
FIG. 1 is a perspective view of an angle-measuring device for determining a relative angular position.

FIG. 1 illustrates an angle-measuring device which has a scanning element 1 and a graduation element 2, graduation element 2 being disposed in a manner allowing rotation about an axis A relative to scanning element 1. For the purpose of clarifying the construction, scanning element 1 and graduation element 2 are shown separately in FIG. 1. In the proper operational state, scanning element 1 and graduation element 2 lie concentrically opposite each other with radial air gap. Scanning element 1 includes a housing 1.1, which, in the exemplary embodiment illustrated, has a housing part 1.11 and is basically ring-shaped. Particularly in the type of construction shown having a graduation element located radially inside, the side of the housing lying radially inside is open.

Figure 2:
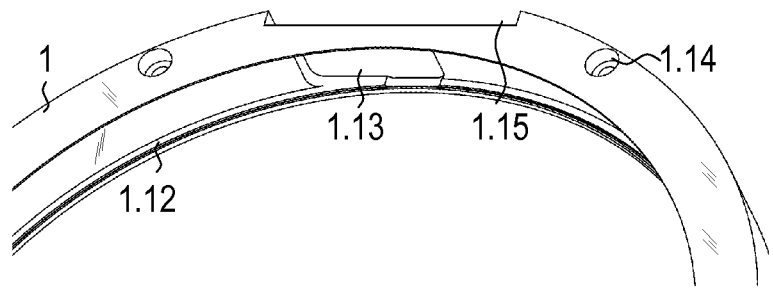
FIG. 2 is a perspective view of a partial area of a housing.
Figure 6:
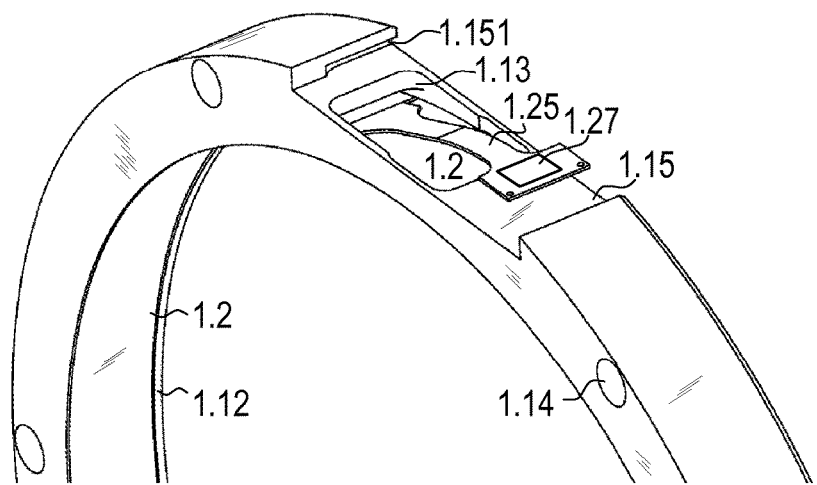
FIG. 6 is a perspective view of a partial area of the housing with mounted printed circuit board.
Figure 9:
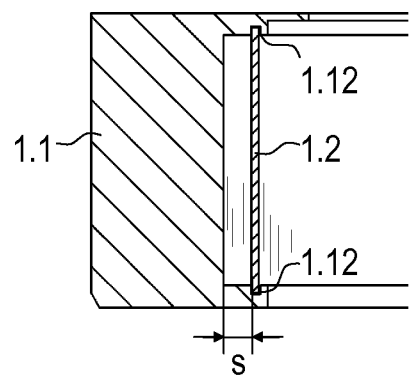
FIG. 9 is a cross-sectional view of a partial area of the scanning element.

FIG. 2 is a perspective partial view of housing 1.1 without housing part 1.11. Housing 1.1 has a guideway 1.12 which, in the exemplary embodiment illustrated, is implemented such that it extends around nearly the entire circumference along a circle line. Guideway 1.12 has two circumferential grooves (see also FIG. 9). Housing 1.1 also has an opening 1.13. Housing 1.1 may be secured in position on a machine part with the aid of mounting bores 1.14. To accommodate housing part 1.11, housing 1.1 has a recess 1.15 (see also FIG. 6), on whose offsets forming the boundaries in the circumferential direction, undercuts 1.151 or grooves are incorporated.

Figure 3:
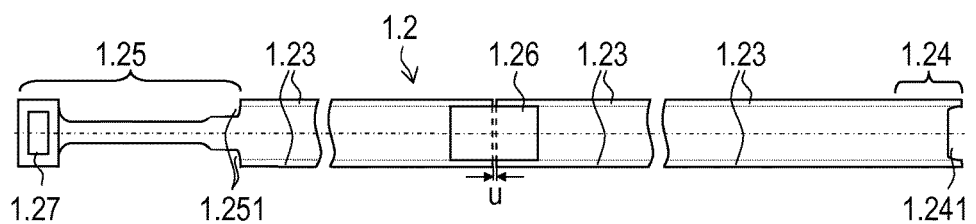
FIG. 3 is a top view of a printed circuit board prior to mounting.
Figure 4:
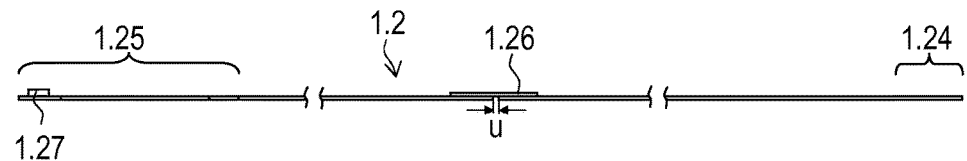
FIG. 4 is a lateral view of the printed circuit board prior to mounting.
Figure 5:
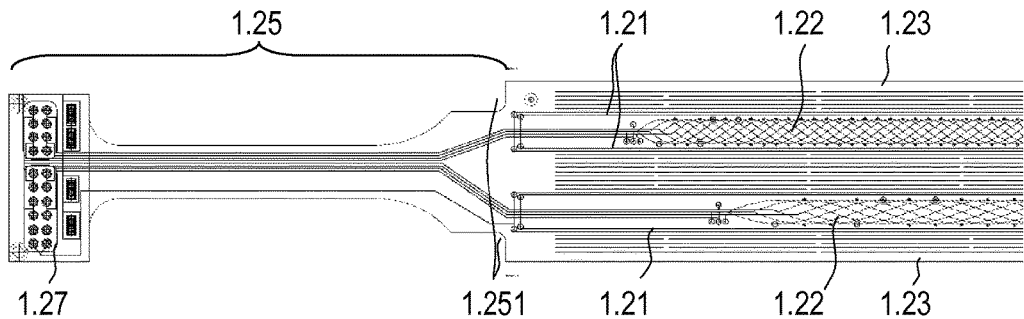
FIG. 5 is a top view of a partial area of the printed circuit board prior to mounting.

FIGS. 3 to 5 illustrate a printed circuit board 1.2 before it is mounted in housing 1.1. FIG. 3 is a top view of printed circuit board 1.2, especially for clarifying the geometric contour of printed circuit board 1.2. Printed circuit board 1.2 has a multilayer construction and has a thickness of, e.g., 0.5 mm. In the exemplary embodiment illustrated, printed circuit board 1.2 is provided in two parts. The two parts of printed circuit board 1.2 are connected mechanically and electrically to each other by a bridging piece 1.26 in the form of a printed-circuit-board piece. The parts of printed circuit board 1.2 are set apart from each other by a gap u. Gap u extends in the longitudinal direction of printed circuit board 1.2, after it has been mounted in housing 1.1, in the circumferential direction or in the measuring direction. Bridging piece 1.26 has a smaller width than printed circuit board 1.2. Before the two parts of printed circuit board 1.2 are ultimately joined by bridging piece 1.26, the parts are aligned relative to each other such that receiver lines 1.22, which are located on both parts, are placed exactly relative to each other. Only after that is the connection finally produced.

Printed circuit board 1.2 has two ends 1.24, 1.25, in each case located opposite gap u. First end 1.24 includes a recess 1.241. Second end 1.25 has two recesses 1.251, as well as an electrical connecting piece 1.27. FIG. 5 illustrates second end 1.25 with the area of printed circuit board 1.2 adjacent to it. According to this, printed circuit board 1.2 includes exciter lines 1.21 and receiver lines 1.22, two tracks being assigned to receiver lines 1.22 in the exemplary embodiment illustrated. Exciter lines 1.21 and receiver lines 1.22 are arranged as printed conductors on multilayer flexible printed circuit board 1.2. The first and second tracks of receiver lines 1.22 in each case have a pair of receiver printed conductors. As illustrated in FIG. 5, an exciter line 1.21 is therefore located both next to the first and next to the second track on both sides.

Neither exciter lines 1.21 nor receiver lines 1.22 are located in the area of second end 1.25. Rather, printed conductors for the supply of exciter lines 1.21 and for conducting the signals received from receiver lines 1.22 to connecting piece 1.27 are located in the area of second end 1.25.

Neither exciter lines 1.21 nor receiver lines 1.22 are in the area of second end 1.24 either. Similarly, edges 1.23, which extend along the longitudinal edges of printed circuit board 1.2, have no exciter lines 1.21 and no receiver lines 1.22.

FIG. 4 illustrates printed circuit board 1.2 in a lateral view. As illustrated, prior to being mounted in housing 1.1, printed circuit board 1.2 has a planar form.

Figure 8:
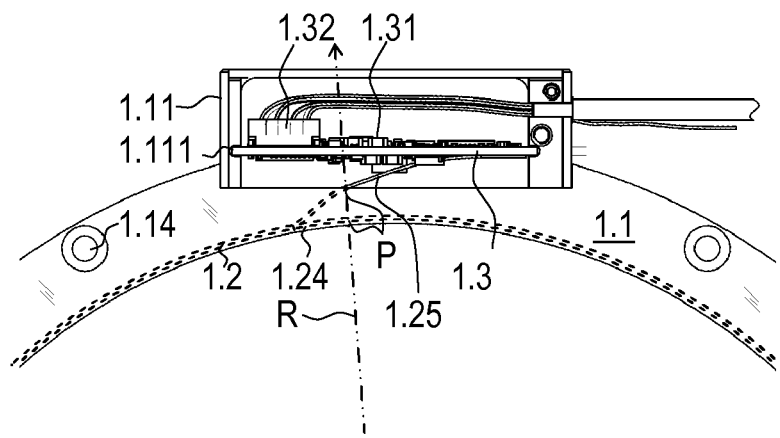
FIG. 8 is a lateral view of a partial area of the scanning element of an angle-measuring device after the mounting of a further housing part.

A board 1.3 is joined to connecting piece 1.27 of printed circuit board 1.2 with the aid of a soldering process, e.g., a hot bar soldering process. FIG. 8 illustrates a corresponding arrangement. Board 1.3 is fitted with electronic components that form an electronic circuit 1.31. In addition, a connector element 1.32 is disposed on board 1.3. Electronic circuit 1.31, and thus scanning element 1, is connectable to sequential electronics via a cable.

Figure 7:
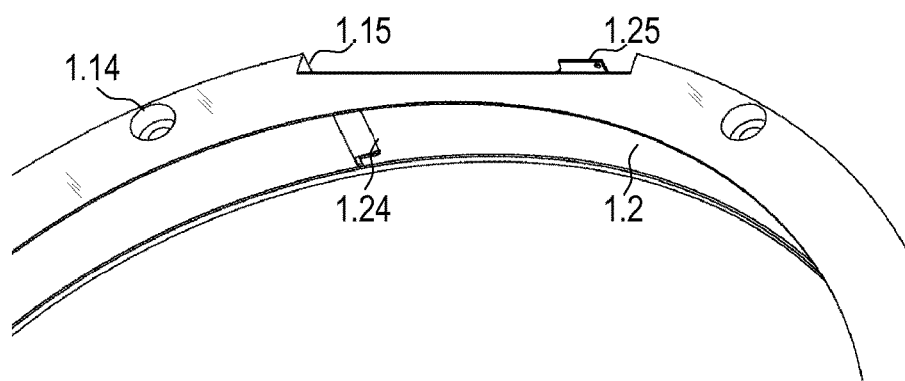
FIG. 7 is a further perspective view of a partial area of the housing with mounted printed circuit board.

Board 1.3 may be joined to printed circuit board 1.2 before printed circuit board 1.2 is placed in housing 1.1. For the sake of clarity, however, board 1.3 is not shown in FIGS. 6 and 7 in order to permit better clarification of the assembly steps. In the course of assembling scanning element 1, printed circuit board 1.2 is introduced through opening 1.13 in the tangential direction into guideway 1.12 and is inserted or pushed into it completely until first end 1.24 of printed circuit board 1.2 contacts the surface of printed circuit board 1.2. At the same time, guideway 1.12, implemented as two grooves, embraces edges 1.23 of printed circuit board 1.2. In addition, printed circuit board 1.2 is guided on the face end in the area of edges 1.23 with the aid of the grooves, so that printed circuit board 1.2 is positioned with form locking in a direction parallel to axis A. Guideway 1.12, i.e., the grooves, is dimensioned such that insertion of printed circuit board 1.2 is possible, and nevertheless, printed circuit board 1.2 is positioned precisely in housing 1.1. In addition, due to the elastic deformation of printed circuit board 1.2, a mechanical stress results which pushes printed circuit board 1.2 against the radially outside walls of the grooves of guideway 1.12. In this manner, despite the imperative play between printed circuit board 1.2 and guideway 1.12, printed circuit board 1.2 is able to be positioned along its longitudinal extension in precise manner necessary for measuring accuracy.

As already explained above, in the assembly phase according to FIGS. 6 and 7, board 1.3 may already be joined to first end 1.24 of printed circuit board 1.2. Alternatively, board 1.3 may also be joined to printed circuit board 1.2 during the phase shown in FIGS. 6 and 7.

Next, housing part 1.11 is inserted into grooves 1.151 in a direction parallel to the direction of axis A. At the same time, board 1.3 is received by likewise axially parallel grooves 1.111 of housing part 1.11. After this assembly step, an arrangement as illustrated in FIG. 8 is provided. Housing part 1.11 is thereupon closed with a cover. To achieve increased tightness, an adhesive agent or potting compound may be introduced into the joints and/or hollow spaces prior to or after the mounting of housing part 1.11.

Due to its insertion into guideway 1.12, printed circuit board 1.2 is deformed elastically along a circle line which is curved about axis A. Thus, in the area of guideway 1.12, printed circuit board 1.2 assumes a ring-shaped or hollow-cylindrical form, printed circuit board 1.2 being longer than guideway 1.12, and especially longer than the circumference necessary for the pure scanning of graduation element 2. The part of printed circuit board 1.2 beyond this length, especially second end 1.25, extends with a directional component directed radially to the outside, as illustrated in FIG. 8, for example. Thus, scanning element 1 has an area within which a radially oriented line R extending out from axis A intersects printed circuit board 1.2 two times (the points of intersection are denoted by the letter P in FIG. 8). In this respect, in the assembled state, printed circuit board 1.2 is disposed with an overlapping end 1.24, end 1.24 being situated radially outside in relation to the circle line.

Assembled scanning element 1 therefore has a flexible printed circuit board 1.2 which is disposed annularly in housing 1.1 and on which exciter lines 1.21 and receiver lines 1.22 are located. Both exciter lines 1.21 and receiver lines 1.22 have an extension along the circumferential direction, and to be more precise, over nearly the entire circumference of scanning element 1. A complete extension over the entire circumference is substantially unable to be produced in practice, or is producible only with increased expenditure, because terminal areas for exciter lines 1.21 and receiver lines 1.22 are provided on scanning element 1, resulting in a discontinuity, even if only slight.

In the proper operational state, graduation element 2 is located radially within scanning element 1, without their touching each other. Graduation element 2 may be used as a rotor and may be mounted on a machine part rotatable about an axis A. On the other hand, scanning element 1 then forms the stator of the angle-measuring device, so that it is secured on a stationary machine part. In response to a relative rotation between graduation element 2 and scanning element 1 about axis A, a signal which is a function of the specific angular position is able to be generated by induction effects in scanning element 1. An angle-measuring device equipped with scanning element 1 may therefore be used to detect an angular position between scanning element 1, which is able to be affixed to a first machine part, and graduation element 2 which is able to be affixed to a second machine part, for example, a shaft.

In this exemplary embodiment, graduation element 2 is in the form of a ring, on whose lateral side, two graduation tracks 2.1, 2.2 are located, disposed with axial clearance. In the example illustrated, graduation tracks 2.1, 2.2 include bars 2.11, 2.21 and gaps 2.12, 2.22 in between, first graduation track 2.1 having sixty-four such bars 2.11, while second graduation track 2.2 includes only thirty-one bars 2.21. Consequently, the two graduation tracks 2.1, 2.2 each include a periodic succession of alternating bars 2.11, 2.21 and gaps 2.12, 2.22. In particular, graduation tracks 2.1, 2.2 have different graduation periods along the circumferential direction.

A prerequisite for the formation of suitable signals is that exciter lines 1.21 generate an electromagnetic exciter field, changing or alternating in time, in the area of receiver lines 1.22 and in the area of graduation tracks 2.1, 2.2 thereby scanned. In the exemplary embodiment illustrated, exciter lines 1.21 are in the form of a plurality of parallel, individual printed conductors traversed by current. When exciter lines 1.21 are supplied with current, an electromagnetic field oriented in the shape of a tube or cylinder forms about respective exciter line 1.21. The field lines of the resulting electromagnetic field extend in the form of concentric circles about exciter lines 1.21, the direction of the field lines being dependent in known manner on the direction of current flow in exciter lines 1.21. Eddy currents are induced in the area of bars 2.11, 2.21, so that the field is modulated as a function of the angular position. Correspondingly, the relative position in the circumferential direction is able to be measured by receiver lines 1.22. The pairs of receiver lines 1.22 of a receiver track are disposed such that they supply signals phase-shifted in each case by 90°, so that the direction of rotation may also be determined. Each of the receiver tracks for determining the position in the circumferential direction, e.g., the angular position, is surrounded by a separate exciter line 1.21. Electronic circuit 1.31 on board 1.3 is used to evaluate and process the signals, so that, for example, digital data, which includes the information about the measured angular position, is formed and output.

The two tracks of receiver lines 1.22 extend virtually around the entire circumference of scanning element 1, e.g., around almost 360° about axis A. This type of construction permits precise angle determination, even in the case of comparatively great mounting tolerances.

Because the two graduation tracks 2.1, 2.2 have slightly different graduation periods, the absolute angular position of graduation element 2 in relation to scanning element 1 may be determined from the signals of receiver lines 1.22 using the beat or Vernier principle.

What is claimed is:

1. A scanning element for an inductive angle-measuring device, comprising:
   a printed circuit board having exciter lines and receiver lines;
   an electronic circuit; and
   a housing, the printed circuit board being arranged within the housing, the housing having a guideway, the printed circuit board being inserted into the guideway and positioned with form locking in a direction parallel to an axis, the printed circuit board being deformed, in response to being inserted into the guideway, along a circle line that is curved about the axis;
   wherein the housing includes a circular side wall that extends parallel to the axis, the housing including a circumferential opening in the side wall and in the guideway, the printed-circuit board insertable through the circumferential opening in a tangential direction into the guideway, the guideway engaging at least one longitudinal edge of the printed-circuit board during the tangential insertion of the printed-circuit board through the opening into the guideway.

2. The scanning element according to claim 1, wherein the printed circuit board is arranged in the housing with an air gap between the housing and the printed circuit board.

3. The scanning element according to claim 1, wherein the printed circuit board is arranged in the housing such that the printed circuit board and the housing touch each other at one edge of the printed circuit board.

4. The scanning element according to claim 1, wherein the guideway engages with the printed circuit board at at least one edge of the printed circuit board.

5. The scanning element according to claim 1, wherein the guideway includes a groove extending over at least a partial circumference.

6. The scanning element according to claim 1, wherein the printed circuit board extends over an angle of 360°.

7. The scanning element according to claim 1, wherein one end of the printed circuit board is arranged radially outside of or radially inside of the circle line.

8. The scanning element according to claim 1, wherein a radially oriented line extending from the axis intersects the printed circuit board at at least two points.

9. The scanning element according to claim 8, wherein the printed circuit board is joined at one end to a board on which the electronic circuit is mounted, the line also intersecting the board.

10. The scanning element according to claim 1, wherein two ends of the printed circuit board overlap in an axial direction.

11. The scanning element according to claim 1, wherein the printed circuit board includes multiple parts joined to each other by a bridging piece.

12. The scanning element according to claim 11, wherein the bridging piece has a smaller extension than the printed circuit board in a direction parallel to the axis.

13. The scanning element according to claim 1, wherein the printed circuit board includes multiple parts, and the parts of the printed circuit board are set apart from each other by a gap in a circumferential direction.

14. The scanning element according to claim 1, wherein the housing has a housing part secured in position on the housing with the aid of an undercut that extends in a direction parallel to the axis.

* * * * *